(12) United States Patent
Stefanovici et al.

(10) Patent No.: US 12,019,705 B2
(45) Date of Patent: Jun. 25, 2024

(54) MACHINE-LEARNING OPTIMIZATION OF DATA READING AND WRITING

(71) Applicant: Microsoft Technology Licensing, LLC, Redmond, WA (US)

(72) Inventors: Ioan Alexandru Stefanovici, Cambridge (GB); Benn Charles Thomsen, London (GB); Alexander Lloyd Gaunt, Cambridge (GB); Antony Ian Taylor Rowstron, Cambridge (GB); Reinhard Sebastian Bernhard Nowozin, Cambridge (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 546 days.

(21) Appl. No.: 17/301,473

(22) Filed: Apr. 5, 2021

(65) Prior Publication Data
US 2021/0224355 A1    Jul. 22, 2021

Related U.S. Application Data

(63) Continuation of application No. 15/786,347, filed on Oct. 17, 2017, now Pat. No. 10,970,363.

(51) Int. Cl.
*G06F 17/18* (2006.01)
*G06F 11/36* (2006.01)
(Continued)

(52) U.S. Cl.
CPC .......... *G06F 17/18* (2013.01); *G06F 11/3692* (2013.01); *G06F 16/2474* (2019.01);
(Continued)

(58) Field of Classification Search
CPC .. G06F 11/3692; G06F 16/2474; G06F 17/18; G06N 20/00; G06N 20/10009; G06N 20/10268; H03M 3/06; H03M 13/37
See application file for complete search history.

(56) References Cited

U.S. PATENT DOCUMENTS

2005/0149826 A1* 7/2005 Uchida ............ G11B 20/10009
2008/0062018 A1* 3/2008 Normile ............... H04N 19/164
375/E7.173
(Continued)

FOREIGN PATENT DOCUMENTS

TW        201734955 A    10/2017

OTHER PUBLICATIONS

Shimobara, Deep-learning-based data page classification for holographic memory (Year: 2017).*
(Continued)

*Primary Examiner* — Mohamed Charioui
*Assistant Examiner* — Dacthang P Ngo
(74) *Attorney, Agent, or Firm* — Alleman Hall & Tuttle LLP

(57) ABSTRACT

Examples are disclosed that relate to encoding data on a data-storage medium. The method comprises obtaining a representation of a measurement performed on the data-storage medium, the representation being based on a previously recorded pattern of data encoded in the data-storage medium in a layout that defines a plurality of data locations. The method further comprises inputting the representation into a data decoder comprising a trained machine-learning function, and obtaining from the data decoder, for each data location of the layout, a plurality of probability values, wherein each probability value is associated with a corresponding data value and represents the probability that the corresponding data value matches the actual data value in the previously recorded pattern of data at a same location in the layout.

19 Claims, 6 Drawing Sheets

(51) Int. Cl.
 *G06F 16/2458* (2019.01)
 *G06N 20/00* (2019.01)
 *G11B 20/10* (2006.01)
 *H03M 5/06* (2006.01)
 *H03M 13/37* (2006.01)

(52) U.S. Cl.
 CPC ....... *G06N 20/00* (2019.01); *G11B 20/10009* (2013.01); *G11B 20/10268* (2013.01); *H03M 5/06* (2013.01); *H03M 13/37* (2013.01)

(56) References Cited

U.S. PATENT DOCUMENTS

| | | | | |
|---|---|---|---|---|
| 2013/0173985 | A1* | 7/2013 | Chung | G06F 11/1012 714/755 |
| 2018/0357530 | A1* | 12/2018 | Beery | H04L 1/0045 |
| 2020/0145661 | A1* | 5/2020 | Jeon | H04N 19/136 |

OTHER PUBLICATIONS

"First Office Action and Search Report Issued in Chinese Patent Application No. 201880066754.3", dated Mar. 31, 2023, 10 Pages.
"Office Action Issued in European Patent Application No. 18800361.0", dated Mar. 3, 2022, 7 Pages.
"Office Action Issued in Indian Patent Application No. 202017016136", dated Mar. 30, 2022, 6 Pages.
"Office Action Issued in European Patent Application No. 18800361.0", dated Sep. 28, 2023, 6 Pages.
"Notice of Allowance Issued in Chinese Patent Application No. 201880066754.3", dated Aug. 18, 2023, 4 Pages.

* cited by examiner

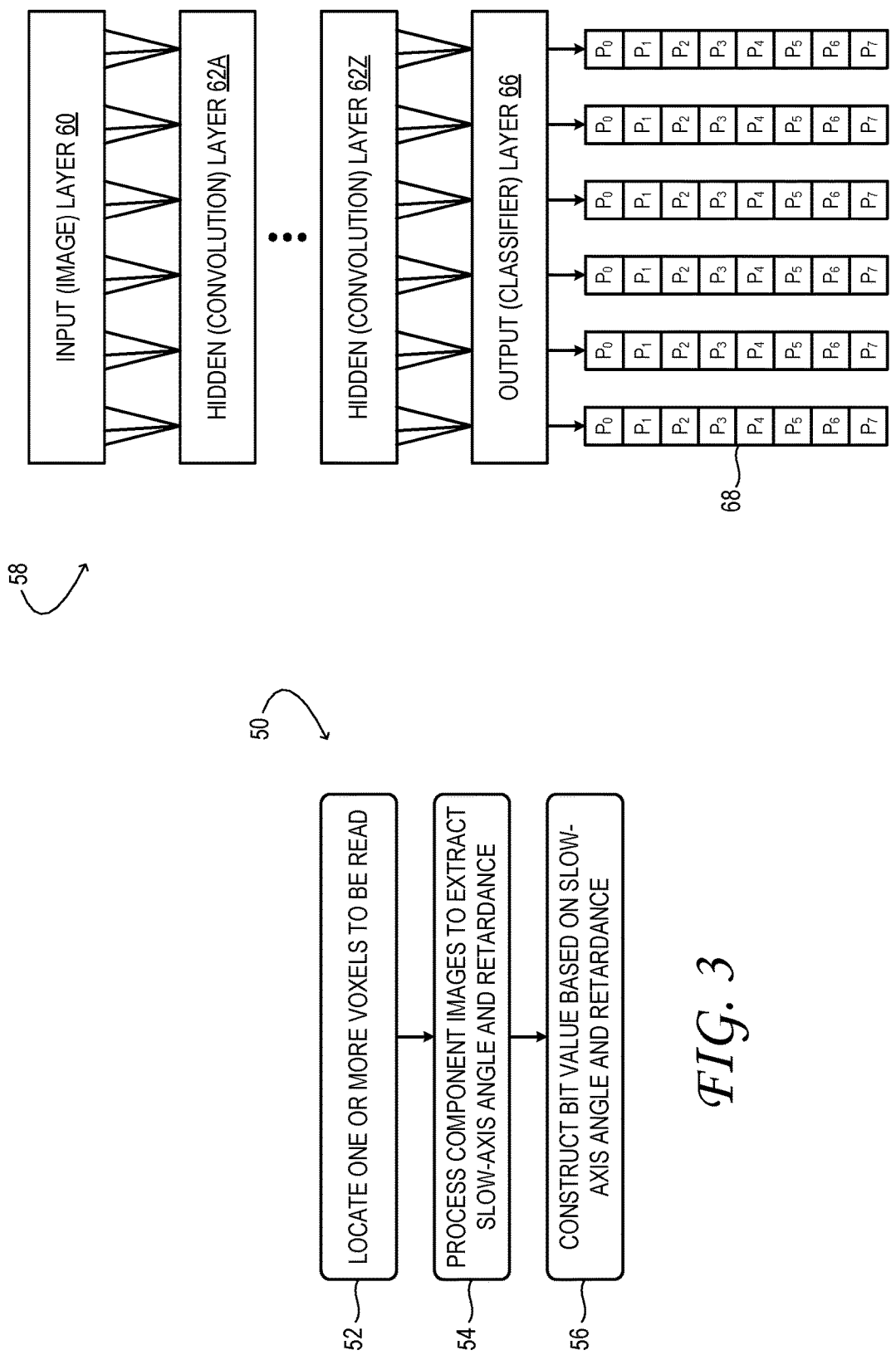

MACHINE-LEARNING OPTIMIZATION OF DATA READING AND WRITING

CROSS REFERENCE TO RELATED APPLICATIONS

This application is a continuation of U.S. patent application Ser. No. 15/786,347, filed Oct. 17, 2017, the entirety of which is hereby incorporated herein by reference for all purposes.

BACKGROUND

Mass storage of digital data relies on conversion of the data into a persistent, physical perturbation, or state change, within a data-storage medium. Conversely, retrieving previously stored data from a data-storage medium requires probing the medium to detect the perturbation. Perturbations applicable to high-throughput, high-density data storage include, for example, localized changes in the magnetic or optical properties of a medium. However, the transduction processes used to store and retrieve data may be subject to interferences.

SUMMARY

Examples are disclosed that relate to reading stored data. The method comprises obtaining a representation of a measurement performed on a data-storage medium, the representation being based on a previously recorded pattern of data encoded in the data-storage medium in a layout that defines a plurality of data locations. The method further comprises inputting the representation into a data decoder comprising a trained machine-learning function, and obtaining from the data decoder, for each data location of the layout, a plurality of probability values, wherein each probability value is associated with a corresponding data value and represents the probability that the corresponding data value matches the actual data value in the previously recorded pattern of data at a same location in the layout.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3 illustrates a comparative, canonical method to decode optically stored data from a set of analyzer-camera images.

FIG. 4 shows aspects of an example convolutional neural network used to decode optically stored data from a set of analyzer-camera images.

DETAILED DESCRIPTION

Figure 1:
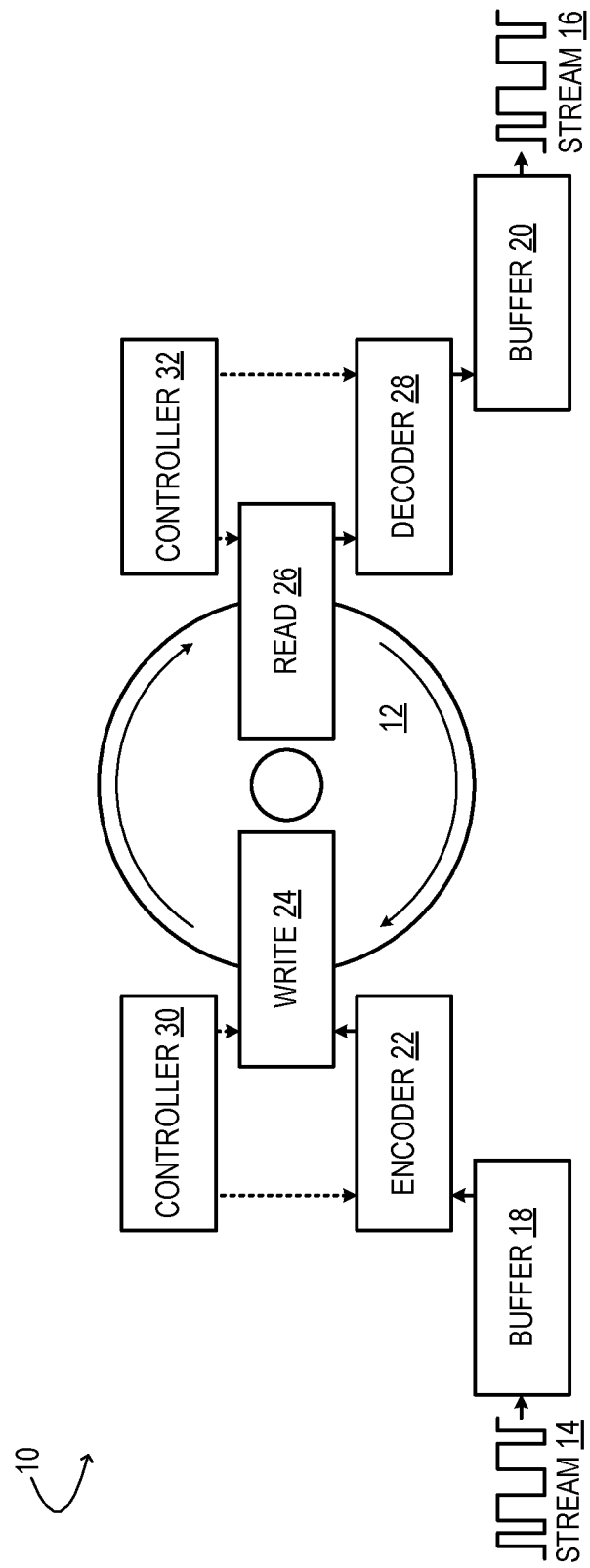
FIG. 1 shows aspects of an example data storage and retrieval system.

This disclosure is presented by way of example, and with reference to the drawing figures listed above. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

Machine-learning can be used to optimize (1) a process by which data is encoded in a data-storage medium, and (2) a process by which previously stored data is decoded—i.e., read or retrieved—from a data-storage medium. These optimizations can be enacted separately or concurrently. In other words, optimization of the decoding process may be informed by, or agnostic to, any optimization of the encoding process. The machine-learning approach disclosed herein provides advantages over a canonical approach, whereby an observable physical property is connected through one or more intermediates to the data read from or written to a data-storage medium.

FIG. 1 shows aspects of an example data storage and retrieval system 10. The illustrated system is an integrated read-write system, capable of data-storage and data-retrieval operations. System 10 may be embodied as a 5D optical storage and retrieval system, as described in further detail below. However, various other data storage and retrieval technologies are also envisaged. Capable of both read and write operations, system 10 may be a component of a data server, for instance. Other systems consonant with this disclosure may be read-only or write-only, and a complementary write or read process may be enacted on a remote system. As examples, a read-only system may be a component of a personal-computer or game-system, and a write-only system may be used for distribution of media content.

System 10 includes physical, data-storage medium 12, which may or may not be removable from the system. In the illustrated example, the data-storage medium takes the form of a disc, but this aspect is not necessary. Alternative geometric forms for the data-storage medium include tapes and slabs.

System 10 is configured to receive a write stream 14 of digital data and to release a read stream 16 of digital data. Data from the write stream may be buffered in write buffer 18 prior to being written to the data-storage medium. Conversely, the data read from the data-storage medium may be buffered in read buffer 20 prior to being released into the read stream.

Encoder 22 of system 10 is configured to enact the logical encoding operation that converts the buffered data into a control signal received by write head 24. The write head includes a hardware configuration that physically writes the data to data-storage medium 12, based on the control signal. Likewise, read head 26 includes a hardware configuration that physically probes the data-storage medium to sense perturbations effected by a previous write operation. In doing so, the read head generates a sensory signal received in data decoder 28. The data decoder is configured to enact the logical decoding operation that converts the sensory signal from the read head back into the previously stored data. Write controller 30 and read controller 32 supply, respectively, appropriate write parameters to the encoder and write head, and appropriate read parameters to the data decoder and read head. In some implementations, controllers 30 and 32 may be combined.

Some of the write parameters supplied by controller 30 may define a configuration of localized data-storage locations of data-storage medium 12. In particular, the data-storage locations may be arranged in one or more mutually parallel layers spaced through a depth of the medium (e.g., in a direction normal to a read/write surface of the medium). The write parameters may specify the number of layers, the depth of each layer, and/or the detailed arrangement of data-storage locations within any layer. In this manner, the write parameters may define the density of data-storage locations, which may or may not be isotropic. The density of data-storage locations may be varied, for instance, in order to optimize some aspect of the write or read operation, or of end-to-end read-write performance. Aspects to be optimized may include read-write accuracy, density of reliably readable stored data, and/or writing or reading throughput, as examples.

Some write parameters and read parameters may be implementation-specific. For instance, the particular parameters that control data storage on a magnetic tape would differ from those used with optical (e.g., holographic) storage media. Accordingly, a more particular variant of data storage and retrieval system 10 will now be described with reference to FIG. 2. From this example, an exemplary range of write and read parameters, and the optimization thereof, will be better understood.

Figure 2:
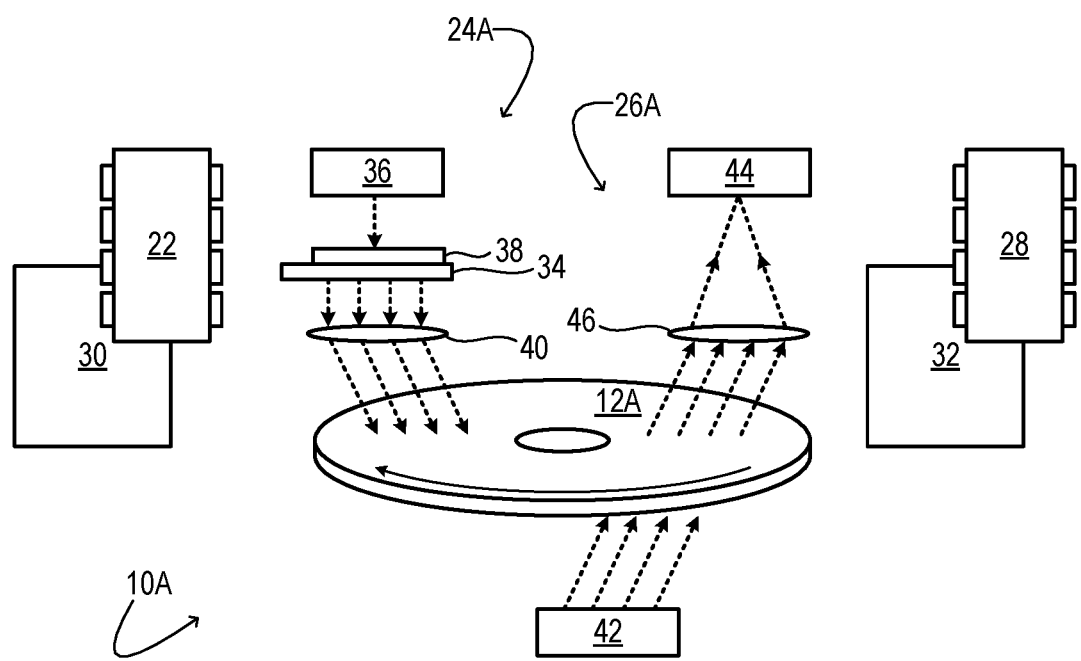
FIG. 2 shows aspects of an example optical data storage and retrieval system.

FIG. 2 shows aspects of an example optical data storage and retrieval system 10A. System 10A is configured to write and store data on optical storage medium 12A. The optical storage medium may differ from one example to the next, but generally includes a solid, dielectric substrate. In some examples, the substrate may be a polymer. In other examples, the substrate may be an inorganic glass, such as silica glass. In some examples, the substrate may take the form of a relatively thin layer (e.g., 30 to 300 microns thick), coupled to a mechanically stable supporting layer of the optical storage medium.

High-power, short-pulse laser irradiance is used to write and store data on optical storage medium 12A. The irradiance induces, at its focus, a long-lived or permanent structural and optical perturbation within the optical storage medium. The perturbation is caused by non-linear (e.g., two-photon) absorption by the substrate. In some cases, a nanoscale 3D structure with grating-like optical properties is formed at the focus of the irradiance. The term 'voxel' is used herein to refer to an individual data-storage location comprising this or another induced perturbation within optical storage medium 12A.

A voxel can store data in many different forms. In principle, any of the Muller-matrix coefficients of the substrate of optical storage medium 12A can be manipulated and used to encode data. In more particular examples, a voxel written into an optical storage medium may be modeled as a waveplate of a retardance $\delta d$ and slow-axis orientation $\Phi$. Both the slow-axis orientation and the retardance (referred to collectively as 'birefringence') may be modulated to encode data. When a voxel of this kind is written by a polarized laser beam, the polarization angle of the beam determines the orientation $\Phi$ of the waveplate grating, while the intensity of beam determines the strength of the grating, and therefore the retardance $\delta d$. This type of optical data storage is also referred to as '5D optical storage'.

By dividing the continuous space of achievable slow-axis orientations and retardances into discrete intervals, multi-bit data values can be encoded into each voxel-viz., by independently coercing the birefringence of that voxel to within one of the discrete intervals. In this manner, each voxel may encode one of R different retardance states at each of Q different polarization angles. Moreover, many parallel layers of voxel structures may be written independently within the optical storage medium by focusing the laser irradiance to specified depths below the irradiated surface of optical storage medium 12A. To achieve acceptably high write speeds using this approach, the laser beam used to write the data may be split into a plurality of independently modulated, voxel-sized write beams, so that a corresponding plurality of voxels may be written simultaneously.

To enable simultaneous writing, write head 24A of system 10A may include an electronically addressable spatial light modulator (SLM) 34, which is coupled operatively to encoder 22 and to write controller 30. The encoder provides an electronic signal to the SLM that digitally defines a holographic projection; the holographic projection consists of a parallel 2D array of write beams, each beam having controllable phase and intensity. Each beam is mapped to a corresponding voxel of optical storage medium 12A. It will be noted that the mapping of hologram pixels to write beams (i.e., voxels) is not necessarily a 1:1 mapping, but may be 2:1, 4:1, or 10:1, among other suitable mappings.

As noted above, the holographic projection from SLM 34 encodes and carries the data pattern to be written into optical storage medium 12A. In some examples, the number of write beams achievable practically is about one-fourth the number of pixels on the SLM. For example, with about 10 million SLM pixels, one-million or more child beams may be formed. Moreover, the array of write beams may be reconfigured at the full refresh rate of the SLM. SLMs employing nematic liquid crystals have refresh rates of the order of 100 frames per second.

In FIG. 2, the source of irradiance for SLM 34 is a high-power laser in the form of femtosecond pulsed laser 36. In some implementations, the laser may be one or more of Q-switched and mode-locked, to provide very brief pulses of very high energy. The irradiance from the laser may comprise a repeating pulse train of subnanosecond photon pulses—e.g., tens to hundreds of femtoseconds in duration, for example. Other forms of laser irradiance are also envisaged.

In some implementations, the array of pixel positions of SLM 34 may be grouped into a plurality of non-overlapping or marginally overlapping holographic zones, which are exposed sequentially to the output beam of laser 36. Each holographic zone may be a two-dimensional area of any desired shape—e.g., rectangular, wedge-shaped, ring-shaped, etc. Accordingly, SLM 34 of system 10A is coupled mechanically to a scanning stage 38, which is configured to change the relative positioning of the laser versus the SLM. In this manner, each of the holographic zones of the SLM may be irradiated in sequence. The scanning stage may be translational and/or rotational, and may be advanced a plurality of times (4, 9, 16 times, etc.) for each time that the SLM is addressed. This approach effectively multiplies the temporal bandwidth of the SLM beyond its maximum refresh rate. Despite the benefits of SLM 34 and related componentry, alternative writing approaches employing serial write heads are also envisaged.

In examples in which data is to be written to a plurality of layers of optical storage medium 12A, write head 22A may include an adjustable objective lens system 40. The adjustable objective lens system is configured to focus the irradiance of the write beams of the SLM on any selected depth layer of the optical storage medium.

Read head 26A of system 10A includes polarized optical probe 42 and an analyzer camera 44. The polarized optical probe may include a low-power diode laser or other plane-polarized light source. Read controller 32 is coupled operatively to the polarized optical probe and configured to control the angle of the polarization plane of emission of the polarized optical probe.

Analyzer camera 44 may include a high-resolution/high frame-rate CMOS or other suitable photodetector array. The analyzer camera is configured to image light from polarized optical probe 42, after such light has interacted with the voxels of optical storage medium 12A. Although FIG. 2 shows transmission of polarized light rays through the medium and on to the camera, the light rays may, in alternative configurations, reach the camera by reflection from the medium.

Each image frame acquired by analyzer camera 44 may include a plurality of component images captured simultaneously or in rapid succession. The analyzer camera may resolve, in corresponding pixel arrays of the component images, localized intensity in different polarization planes. To this end, the analyzer camera may include a switchable or tunable polarization control in the form of liquid-crystal retarders or Pockels cells, for example.

In one particular example, four images of each target portion of optical storage medium 12A are acquired in sequence by the analyzer camera as the polarized optical probe 42 is rotated through four different polarization angles. This process is akin to measuring basis vectors of a multi-dimensional vector, where here the 'vector' captures the birefringent properties of the voxels of the imaged target portion. In some examples, a background image is also acquired, which captures the distribution of sample-independent polarization noise in the component images.

In examples in which data is to be read from a plurality of layers of optical storage medium 12A, read head 26A may include an adjustable collection lens system 46. The adjustable collection lens system may collect light rays diffracted from a selected depth layer of the optical storage medium, and reject other light rays. In other implementations, lensless imaging based on interferometry may be employed.

In the examples here illustrated, data decoder 28 is configured to receive the component images from analyzer camera 44 and to enact the image processing necessary to retrieve the data stored in optical storage medium 12A. Such data may, as noted above, be decoded according to a canonical method in which an observable physical property is connected through one or more intermediates to the data read from or written to a data-storage medium. However, that approach may pose various disadvantages compared to the machine learning-based methods described herein. Such disadvantages are illustrated below with reference to an example canonical method illustrated at 50 of FIG. 3.

At 52 of canonical method 50, one or more voxels sought to be read are located in the co-registered component images from analyzer camera 44. To locate the voxels, a geometric camera model appropriate for read head 26A is employed. The geometric camera model is based on the various metrics of read head 26A and is assumed to govern the mapping of each voxel of optical storage medium 12A to a corresponding locus of the co-registered component images. The camera model may incorporate fixed and adjustable parameters, such as the power of adjustable collection lens system 46 and the alignment of the analyzer camera axis relative to the optical storage medium.

At 54 of method 50, the identified portions of the component images that correspond to voxels of interest are processed in data decoder 28, in order to extract the slow-axis angle and retardance values of each voxel. An image-processing algorithm that solves a system of equations at each co-registered pixel position is applied to the four component images, after subtraction of the background. The product of this algorithm is a composite image pair: one retardance image representing phase displacement (in nanometers, for example), and one azimuth image representing the rotation of the polarization angle relative to that of polarized optical probe 42 (in degrees). In this approach, the quality of the composite image pair is highly dependent on the manner of selection of the background image (which may be somewhat subjective) and on the read parameters supplied to the polarized optical probe and analyzer camera.

At 56 of method 50, the slow axis and retardance values computed above are further processed in order to retrieve the multi-bit data previously written to the voxels of interest. To this end, a data model relating the bit value to the slow-axis angle and retardance is invoked. Data models typically applied to this problem may rely on simple signal processing, may be non-robust, and may be susceptible to errors and interferences. Such errors may derive from resultant variances in the retardance and slow-axis angle outputs, and from noise in the system (which accumulates with the number of layers of voxels and with the voxel density of each layer), as examples. Additional noise arises from the finite depth of field of the optical system (which may distort the shape and size of a given voxel in a component image, depending on which portion of the voxel is in focus, top-to-bottom).

In view of the foregoing analysis, it can be seen that canonical method 50 of decoding image data into multi-bit data values is subject to error, and that the error is influenced by the selection of various write and read parameters of the end-to-end data storage and retrieval operation. Canonical decoding method 50 may be suitable provided that optimized parameters are known ab initio. The same can be said of a complementary canonical encoding method that maps the bit value sought to be stored into intermediate slow-axis angle and retardance and values, then written to an assumed voxel location based on a geometric camera model. However, such methods do not easily inform the process of optimizing the many write and read parameters associated with data storage and retrieval. In effect, a parameter-dependent error is attached to each processing step of the canonical methods. Because the dependence of that error on the write and read parameters is often non-linear, it may be difficult to model the propagation of the error, which would be necessary to forecast any metric of performance as a function of trial parameters.

In view of the foregoing, FIG. 4 illustrates a convolutional neural network (CNN) 58 as a basis of an example machine-learning alternative to the canonical approach of FIG. 3. With CNN 58, stored data is decoded from component image data without explicit computation of any intermediate metric, such as the birefringence of particular voxels. Instead, image data from analyzer camera 44 is received at input layer 60 of CNN 58. The received image data is transformed successively, in each of a series of hidden layers 62. Each hidden layer (62A, 62Z, for example) includes an array of logic constructs called 'neurons'. Each neuron receives its input from neurons of the layer above, enacts a logic operation on the input, and passes an output to neurons of the layer below.

In contrast to those of a generic neural network, the neurons of CNN 58 receive input only from the neuron directly above, and in some examples from close neighbors. This feature reflects the fact that the voxels of optical storage medium 12A are substantially, if imperfectly, localized in every image frame.

Among the hidden layers 62 of CNN 58 are one or more convolution, or filter, layers. Each neuron in a convolution layer achieves its filtering operation by computing a dot product between its vector of inputs and a filter vector of the same dimensions. The elements of each filter vector are adjustable parameters called 'filter weights'. In machine-learning CNN implementations, the filter weights are optimized automatically, in a closed-loop manner, so as to cause the CNN to converge to a given, known solution for a given training image provided as input. To facilitate back-propagation, the filtering and other logic functions enacted by each neuron may be required to be differentiable with respect to each associated filter weight. In some examples, each neuron may include logic configured to compute its own derivatives. Such derivatives may be used in parameter optimization procedures, such as the 'steepest descent' method, among others.

CNN 58 may contain a large number of filters arranged in a plurality of hidden layers 62. In contrast to a generic neural network, where the filter vectors of each neuron are optimized independently, the filter vectors in CNN 58 are constrained to be the same for every voxel-corresponding locus of a given convolution layer. This feature recognizes inherent image similarities among voxels.

In CNN 58, each neuron of output layer 66 provides a labeled probability array 68. The labels attached to the elements of the array span all possible data values that could be stored in the voxel classified to that neuron. In the example illustrated in FIG. 4, there are eight possible data values i for each voxel (e.g., two retardance values for each of four slow-axis angles). The elements $P_i$ of the array express the probability that the voxel contains data that matches the label i. Accordingly, all elements of each probability array sum to 1. Shorter and longer bit values are also envisaged.

In contrast to canonical algorithms that assign multi-bit data values based on computed intermediates, CNN 58, executing within a machine-learning algorithm, learns how to efficiently resolve the unprocessed component images directly into appropriate output classes. This occurs without pre-engineered filters, feature selection, or pre-processing—which would likely decrease the optimality of the classification due to inaccurate assumptions or bias. As noted above, the filters are learned during a training phase, through the process of back-propagation. Provided that a sufficient quantity of labeled data is available during the training phase, the CNN can potentially learn to cope with noise and/or distortion in the voxel geometry. In addition, CNNs are naturally invariant to translational shifting in the component images at the input layer, providing tolerance to variances and offsets among the various component images (training and operational).

The training data for the machine learning model may include measurements made on actual data-storage media (e.g., test standards corresponding to known, ground-truth data arrays), as well as synthetic data based on simulation of physical characteristics of the read process (e.g., ray tracing simulations). Using either approach, CNN 58 may be trained on images corresponding to different polarization-plane settings of polarized optical probe 42 and of analyzer camera 44. Optimization of these settings can be thought of as a selection among various basis vectors—any of which would span the birefringence space of the voxels, but with potentially different non-idealities and exposure to noise. Through back-propagation in CNN 58, increasingly ideal and noise-tolerant basis vectors are converged upon. Thus, the final basis is one that optimally extracts the maximum information with the fewest number of measurements possible (e.g., fewest component images, polarizer/analyser settings, etc.).

While CNN 58 may provide various advantages, as described above, data decoder 28 may, in other examples, employ other machine learning models and strategies. The data decoder may employ an autoencoder, decision forest, or support vector machine, as examples. In addition, while an end-to-end machine learning approach governing both encoding and decoding of data may be desirable, the use of machine learning does not necessarily preclude human-engineered feature selection in every example. Nor does it necessarily preclude pre-processing or data conditioning as applied to some aspects of the writing and/or reading operations.

The configurations described above enable various methods for storage and retrieval of data, for encoding and decoding of data, for training a CNN or other machine-learning function to decode the data, and for optimizing the various read and write parameters used for data storage and retrieval. Accordingly, example methods are now described with continued reference to the above configurations. It will be understood, however, that the methods here described, and others within the scope of this disclosure, may be used with other configurations as well (such as those employing other machine learning functions, optimization machines, etc.). Naturally, each execution of a method may change the entry conditions for a subsequent execution and thereby invoke a complex decision-making logic. Such logic is fully contemplated herein.

Figure 5:
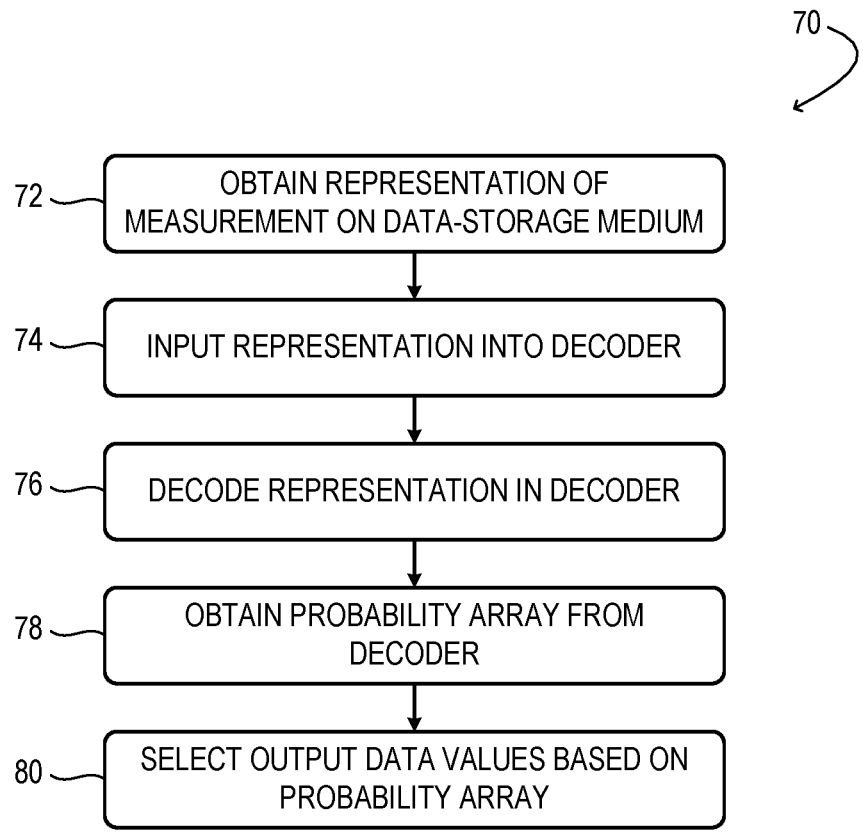
FIG. 5 illustrates an example method to decode data stored on a data-storage medium.

FIG. 5 illustrates an example method 70 for reading previously stored data from a data-storage medium. At 72 of method 70, a representation of a measurement performed on a data-storage medium is obtained. The representation is based upon or responsive to (i.e., represents a reading of), a previously recorded pattern of data encoded in the data-storage medium, in a layout that defines a plurality of data locations. The 2D layout of data locations in the representation (e.g., an image) may map to a physical configuration of data-storage locations in the data-storage medium, which could be 3D in some examples. For instance, the configuration of data-storage locations may include a single layer, or a plurality of layers differing in depth. In some examples, the data-storage locations of each layer of the medium are regularly spaced. In other examples, the spacing may be varied. To obtain the representation, the plurality of data locations of the data-storage medium may be actively probed.

The manner of probing the plurality of data locations is based on the mode of data-storage employed in the system. With 5D optical storage, for example, where the data-storage medium comprises an optical storage medium (e.g., silica glass), the act of probing the data locations may include setting polarization states of a polarized optical probe, which is then used to irradiate the data locations of the medium. In some examples, irradiating the data locations may include focusing irradiance on a layer of data locations, the layer being one of a plurality of layers of the data-storage medium. In this example, the representation takes the form of one or more component images, and is acquired by concurrently imaging the data-storage medium as the optical-probe irradiance is applied. Imaging the data-storage medium may include detecting light from the optical probe which is transmitted through, or reflected by, the data-storage medium.

In other implementations, the data-storage medium may be a magnetic storage medium, which is probed by rastering a conductor across a surface of the medium and concurrently measuring the electric current induced in the conductor. In still other implementations, the data-storage medium may comprise a material which is stable in two or more nuclear- or electron-spin states, switchable independently within small volume elements of the material. Such a medium may be probed using magnetic resonance imaging, for example.

At 74 of method 70, the representation of the measurement is input into a data decoder that executes a trained machine-learning function. In some examples, the machine-learning function may include a CNN. In other examples, the machine-learning function may include any other suitable machine-learning function, such as an auto-encoder, a decision forest, or a support-vector machine, as examples. In some examples, as further described below, the machine-learning function of the data decoder may be trained using a plurality of training-data sets that differ with respect to one or more data-storage and/or data-decoding parameters. In doing so, the machine-learning function may be evaluated repeatedly, in scanning through one or more parameters for storage and retrieval of the previously recorded pattern of data on the data-storage medium.

At 76 the representation of the measurement is decoded via the data decoder. The machine-learning function of the data decoder may be trained to associate a probability array to each data-storage location based on the representation. In implementations in which the representation comprises image data, the probability array may be based on the image data.

At 78, therefore, an array of probability values is obtained from the data decoder, for each data location of the layout. Each probability value in the array is labelled with a corresponding data value and represents the probability that the corresponding data value matches an actual data value in the previously recorded pattern of data at a same location in the layout. In 5D optical-storage examples, each corresponding data value may distinguish a birefringence value localized to a voxel of the data-storage medium. More particularly, each possible data value may distinguish one or more of a slow-axis angle and a retardance value. For instance, each possible data value may distinguish from among three or more slow axis angles, and two or more retardance values for each angle.

At 80 of method 70, one of the corresponding data values is selected for output, for each data-storage location. Selection may be based on a comparison among the probability values (i.e., elements) of the probability array associated with that data location. For instance, the data value corresponding to the highest probability may be selected for output.

Figure 6:
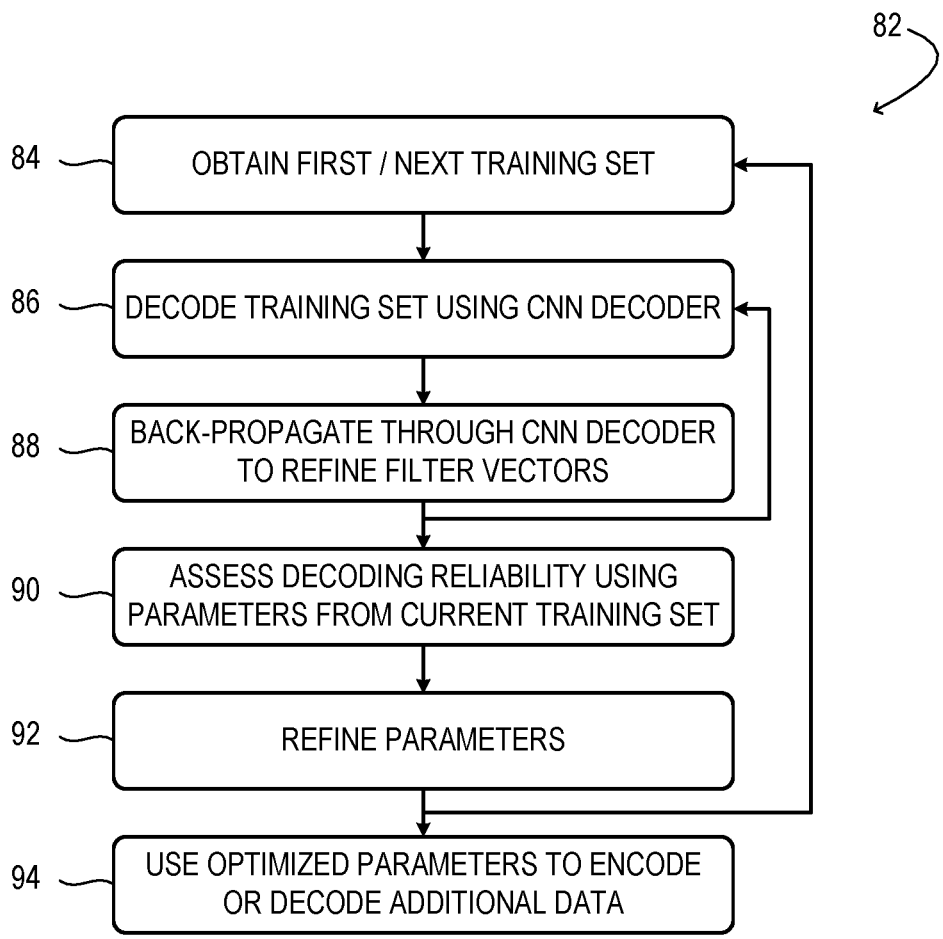
FIG. 6 illustrates an example method to encode data onto a data-storage medium.

FIG. 6 illustrates an example method 82 for end-to-end training and parameter optimization in a data storage and retrieval system. It will be understood, however, that various aspects of the illustrated method are also applicable to more limited training scenarios—e.g., to the training of a data decoder in a read-only system.

At 84 of method 82, a training set applicable to the training of a machine-learning function of a data decoder is obtained. Each training set may include a series of test-data representations. As noted above, two different kinds of training sets are envisaged: a real data set created by the system upon reading a standard storage medium, and a simulated data set not associated with any tangible storage medium. A training set of either kind is associated with a ground-truth data array—the data that the training set represents—and with a particular set of write and/or read parameters. In the case of real data from a standard storage medium, the associated parameters are the actual parameters used to write the standard storage medium and to acquire each test-data representation. In the case of simulated data, the associated parameters are the parameters assumed in the simulation. In the particular example of 5D optical storage, each training set comprises image data. Such image data may be derived from reading a standard optical storage medium, or may be created synthetically, using a ray tracing program.

At 86 the training set is decoded using a decoder configured to execute a machine-learning function in the form of a CNN. The CNN employs various filter vectors and returns a labelled probability array, as described above. At 88, the filter vectors of the CNN are refined via back-propagation, with reference to the ground-truth data vector corresponding to the current training set. After the filter vectors for the current training set are refined, the reliability of decoding the data from the current data set is assessed, at 90, using the refined filter vectors.

In general, the labelled probability array output from the CNN is used to assess reliability. In some examples, assessing the reliability comprises comparing the decoded data to corresponding ground-truth values. The decoding may be reliable, for instance, to the extent that the label corresponding to the element of highest probability matches the corresponding ground-truth value. In other examples, assessing the reliability comprises comparing against each other the probability values of each element of the labeled probability array. For instance, a reliability may be assessed based on the extent to which the element of highest probability exceeds that of the next-highest probability value in the array.

As the various filter vectors employed in the data decoder are already refined at this point in method 82, the reliability assessed at 90 is a suitable figure of merit for ranking the various adjustable parameters used in the write and read operations. In some examples, the first and subsequent training sets may differ with respect to the layout and 3D configuration of the data-storage medium. In some examples, the first and subsequent training sets may differ with respect to one or more properties of the write-beam used to encode the data. Such properties may include write-beam intensity, polarization, and/or wavelength. In some examples, the first and subsequent training sets may differ with respect to read-beam properties, such as polarization state of the polarized optical probe.

Accordingly, method 82 now returns to 84 where a subsequent training set is obtained. The subsequent training set is one having write or read parameters that differ from the training set already assessed. Thus, by iterating through the entire write and read parameter space, optimized parameter values, at 92, may be identified. It will be noted that data-decoding reliability is not the only figure of merit that may be used to optimize the write and read parameters. Other figures of merit include performance factors as data-storage density, data-writing bandwidth, data-reading bandwidth, for example. In some examples, two or more figures of merit may be optimized in a concerted and/or closed-loop manner. Thus, the subsequent training-data set obtained at 84 may comprise a training-data set having a data-writing parameter configuration adjusted so as to increase the figure of merit (i.e., metric of data-writing and/or data-reading performance). In this manner, the data-writing and data-reading parameter configurations optimized in method 82 may be selected further based on any suitable metric of data-writing or data-reading performance, or any combination thereof.

At 94, after parameter optimization is achieved, optimized write parameters may be used to encode additional data, which then may be read using the optimized read parameters.

The methods and processes described herein may be tied to a computing system of one or more computing devices. In particular, such methods and processes may be implemented as a computer-application program or service, an application-programming interface (API), a library, and/or other computer-program product.

Figure 7:
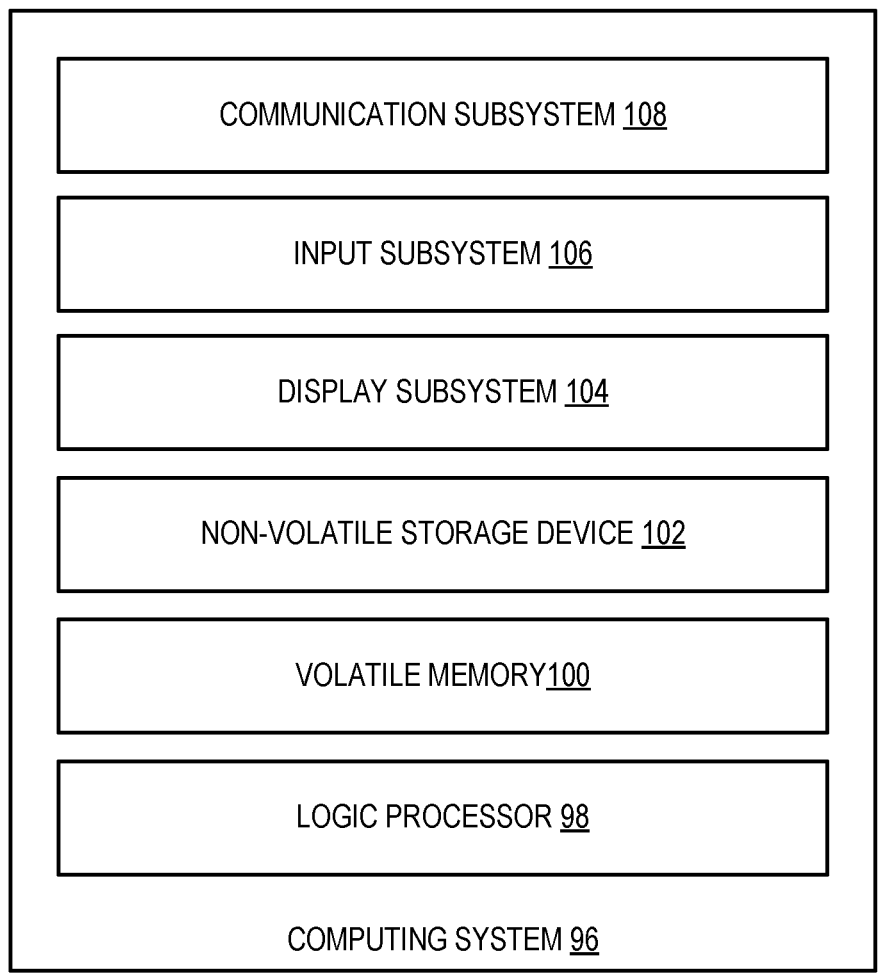
FIG. 7 shows a block diagram of an example computing system.

FIG. 7 schematically shows a non-limiting embodiment of a computing system 96 that can enact one or more of the methods and processes described above. Computing system 96 is shown in simplified form. Computing system 96 may take the form of one or more benchtop or server computers and/or dedicated electronic controllers. Encoder 22, decoder 28, and controllers 30 and 32 are examples of computing system 96.

Computing system 96 includes a logic processor 98 volatile memory 100, and a non-volatile storage device 102. Computing system 96 may optionally include a display subsystem 104, input subsystem 106, communication subsystem 108, and/or other components not shown in FIG. 7.

Logic processor 98 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 98 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 102 includes one or more physical devices configured to hold instructions executable by the logic processors to implement the methods and processes described herein. When such methods and processes are implemented, the state of non-volatile storage device 100 may be transformed—e.g., to hold different data.

Non-volatile storage device 102 may include physical devices that are removable and/or built-in. Non-volatile storage device 102 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 102 may include nonvolatile, dynamic, static, read/write, read-only, sequential-access, location-addressable, file-addressable, and/or content-addressable devices. It will be appreciated that non-volatile storage device 102 is configured to hold instructions even when power is cut to the non-volatile storage device 102.

Volatile memory 100 may include physical devices that include random access memory. Volatile memory 100 is typically utilized by logic processor 98 to temporarily store information during processing of software instructions. It will be appreciated that volatile memory 100 typically does not continue to store instructions when power is cut to the volatile memory 100.

Aspects of logic processor 98, volatile memory 100, and non-volatile storage device 102 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 104 may be used to present a visual representation of data held by non-volatile storage device 102. The visual representation may take the form of a graphical user interface (GUI). As the herein described methods and processes change the data held by the non-volatile storage device, and thus transform the state of the non-volatile storage device, the state of display subsystem 104 may likewise be transformed to visually represent changes in the underlying data. Display subsystem 104 may include one or more display devices utilizing virtually any type of technology. Such display devices may be combined with logic processor 98, volatile memory 100, and/or non-volatile storage device 102 in a shared enclosure, or such display devices may be peripheral display devices.

When included, input subsystem 106 may comprise or interface with one or more user-input devices such as a keyboard, mouse, touch screen, etc. When included, communication subsystem 108 may be configured to communicatively couple various computing devices described herein with each other, and with other devices. Communication subsystem 108 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 96 to send and/or receive messages to and/or from other devices via a network such as the Internet.

One aspect of this disclosure is directed to a method for reading stored data, which is enacted on a computing device. The method comprises obtaining a representation of a measurement performed on a data-storage medium, the representation based on a previously recorded pattern of data encoded in the data-storage medium in a layout that defines a plurality of data locations; inputting the representation into a data decoder comprising a trained machine-learning function; and obtaining from the data decoder, for each data location of the layout, a plurality of probability values, each probability value having a corresponding data value and representing a probability that the corresponding data value matches an actual data value in the previously recorded pattern of data at a same location in the layout.

In some implementations, the method further comprises, for each data-storage location, selecting one of the corresponding data values for output based on the plurality of probability values associated with that data location. In some implementations, obtaining the representation of the measurement comprises probing the plurality of data locations of the data-storage medium to acquire the representation. In some implementations, the data-storage medium comprises an optical storage medium, the representation comprises an image, each corresponding data value differs with respect to a birefringence value, and probing the plurality of data-storage locations comprises irradiating the data-storage locations with a beam of a predetermined polarization state. In some implementations, the machine-learning function comprises a convolutional neural network. In some implementations, the layout maps to a physical configuration of one or more layers of the data-storage medium. In some implementations, the machine-learning function is trained using a plurality of training-data sets that differ with respect to one or more data-storage parameters, and is evaluated iteratively in setting the one or more data-storage parameters for storage of the previously recorded pattern of data on the data-storage medium.

Another aspect of this disclosure is directed to a method for optically reading previously stored data from an optical storage medium, enacted on a computing device. The method comprises: setting a polarization state of an optical probe; irradiating with the optical probe a plurality of storage locations of the optical storage medium and concurrently imaging the data-storage medium to acquire a representation image of the previously stored data, the representation image comprising a plurality of data locations corresponding to the plurality of storage locations of the optical storage medium; and decoding the representation image via a data decoder, the data decoder comprising a machine-learning function trained to associate a probability array to each data-storage location based on the representation image, wherein each element of the probability array corresponds to a possible data value and represents a probability that the previously stored data of the associated data-storage location matches the possible data value.

In some implementations, imaging the data-storage medium includes detecting light from the optical probe which is transmitted through the optical storage medium. In some implementations, and each possible data value distinguishes one or more of a slow-axis angle and a retardance value. In some implementations, each possible data value distinguishes from among three or more slow axis angles. In some implementations, the optical storage medium comprises a silica glass medium. In some implementations, irradiating the plurality of data-storage locations includes focusing irradiance on a layer of data-storage locations, the layer being one of a plurality of layers data-storage locations of the optical storage medium.

Another aspect of this disclosure is directed to a method for encoding data on a data-storage medium, enacted on a computing device. The method comprises: obtaining a first training-data set to train a data decoder, the first training-data set corresponding to a first data-writing parameter configuration; using the first training-data set and corresponding ground-truth data, training a machine-learning function of the data decoder to decode data written with the first data-writing parameter configuration, the machine-learning function outputting a labelled probability array corresponding to the first training-data set; obtaining a second training-data set to train the data decoder, the second training-data set corresponding to a second data-writing parameter configuration; using the second training-data set and corresponding ground-truth data, training the machine-learning function of the data decoder to decode data written with the second data-writing parameter configuration, the machine-learning function outputting a labelled probability array corresponding to the second training-data set; assessing, based on the labelled probability array, a reliability of decoding data written with the first data-writing parameter configuration and a reliability of decoding data written with the second data-writing parameter configuration; selecting one of the first or second data-writing parameter configurations based on the reliabilities assessed of decoding at least the first and second training data sets; and writing data to the data-storage medium using the selected one of the first or second data-writing parameter configurations.

In some implementations, the one of the first or second data-writing parameter configurations is selected further based on a metric of data-writing performance, and obtaining the second training-data set comprises obtaining a training-data set with a data-writing parameter configuration adjusted so as to increase the metric of data-writing performance. In some implementations, the first and second training data sets differ with respect to the layout. In some implementations, the data-storage medium comprises an optical storage medium, the first and second training data sets comprise images, each element of the labelled probability array corresponds to a possible data value, and the data is encoded using an optical write-beam. In some implementations, the first and second training data sets differ with respect to one or more properties of the write-beam used to encode the data from which the respective first or second training data set was obtained. In some implementations, obtaining the first and second training data sets includes probing the data-storage medium with a read beam and concurrently imaging the data-storage medium, and the first and second training data sets differ with respect to the read-beam properties. In some implementations, assessing the reliability comprises one or more of comparing the probability values of each element of the labeled probability array and comparing the decoded data to the corresponding ground-truth values.

It will be understood that the configurations and/or approaches described herein are exemplary in nature, and that these specific examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:
1. On a computing device, a method for encoding data on a data-storage medium, the method comprising:
   obtaining a first training-data set to train a data decoder, the first training-data set corresponding to a first data-writing parameter configuration;

using the first training-data set and corresponding ground-truth data, training a machine-learning function of the data decoder to decode data written with the first data-writing parameter configuration, the machine-learning function outputting a first labelled probability array corresponding to the first training-data set;

obtaining a second training-data set to train the data decoder, the second training-data set corresponding to a second data-writing parameter configuration, wherein obtaining the first and second training-data sets includes probing the data-storage medium with a read beam and concurrently imaging the data-storage medium;

using the second training-data set and corresponding ground-truth data, training the machine-learning function of the data decoder to decode data written with the second data-writing parameter configuration, the machine-learning function outputting a second labelled probability array corresponding to the second training-data set;

assessing, based on the first and second labelled probability arrays, a reliability of decoding data written with the first data-writing parameter configuration and a reliability of decoding data written with the second data-writing parameter configuration;

selecting one of the first or second data-writing parameter configurations based on the reliabilities assessed of decoding data of at least the first and second training data sets; and writing data to the data-storage medium using the selected one of the first or second data-writing parameter configurations.

2. The method of claim 1 wherein the one of the first or second data-writing parameter configurations is selected further based on a metric of data-writing performance, and wherein obtaining the second training-data set comprises obtaining a training-data set with a data-writing parameter configuration adjusted so as to increase the metric of data-writing performance.

3. The method of claim 1 wherein the first and second training data sets differ with respect to layout.

4. The method of claim 1 wherein the data-storage medium comprises an optical storage medium, the first and second training data sets comprise images, each element of the labelled probability array corresponds to a possible data value, and the data is encoded using an optical write-beam.

5. The method of claim 1 wherein the first and second training data sets differ with respect to one or more properties of a write-beam used to encode the data from which the respective first or second training data set was obtained.

6. The method of claim 1 wherein the first and second training data sets differ with respect to the read-beam properties.

7. The method of claim 1 wherein assessing the reliability comprises one or more of comparing the probability values of each element of the labeled probability array and comparing the decoded data to the corresponding ground-truth values.

8. On a computing device, a method for encoding data on an optical data-storage medium, the method comprising:
obtaining a first training-data set to train a data decoder, the first training-data set corresponding to a first data-writing parameter configuration and comprising images;

using the first training-data set and corresponding ground-truth data, training a machine-learning function of the data decoder to decode data written with the first data-writing parameter configuration, the machine-learning function outputting a first labelled probability array corresponding to the first training-data set;

obtaining a second training-data set to train the data decoder, the second training-data set corresponding to a second data-writing parameter configuration and comprising images;

using the second training-data set and corresponding ground-truth data, training the machine-learning function of the data decoder to decode data written with the second data-writing parameter configuration, the machine-learning function outputting a second labelled probability array corresponding to the second training-data set;

assessing, based on the first and second labelled probability arrays, a reliability of decoding data written with the first data-writing parameter configuration and a reliability of decoding data written with the second data-writing parameter configuration;

selecting one of the first or second data-writing parameter configurations based on the reliabilities assessed of decoding data of at least the first and second training data sets; and writing data to the optical data-storage medium using the selected one of the first or second data-writing parameter configurations, wherein the data is encoded using an optical write beam and read using a beam of a predetermined polarization state, and wherein each corresponding data value differs with respect to a birefringence value, and wherein each element of the first and second labelled probability arrays corresponds to a possible data value and represents a probability that the corresponding possible data value matches an actual data value encoded in the optical storage medium.

9. The method of claim 8 wherein the one of the first or second data-writing parameter configurations is selected further based on a metric of data-writing performance, and wherein obtaining the second training-data set comprises obtaining a training-data set with a data-writing parameter configuration adjusted so as to increase the metric of data-writing performance.

10. The method of claim 8 wherein the first and second training data sets differ with respect to the layout.

11. The method of claim 8 wherein the first and second training data sets differ with respect to one or more properties of the write-beam used to encode the data from which the respective first or second training data set was obtained.

12. The method of claim 8 wherein obtaining the first and second training data sets includes probing the optical data-storage medium with a read beam and concurrently imaging the optical data-storage medium, and wherein the first and second training data sets differ with respect to the read-beam properties.

13. The method of claim 8 wherein assessing the reliability comprises one or more of comparing the probability values of each element of the labeled probability array and comparing the decoded data to the corresponding ground-truth values.

14. The method of claim 8 wherein the machine-learning function comprises a convolutional neural network.

15. An optical data storage and retrieval system comprising:
an optical data-storage medium; and
one or more logic devices configured to execute instructions to operate data decoder including a machine-learning function, the machine-learning function being trained (a) using a first training-data set corresponding to a first data-writing parameter configuration and corresponding ground-truth data, the machine-learning function being trained to decode data written with the first data-writing parameter configuration and configured to output a first labelled probability array corresponding to the first training-data set, the first training-data set comprising images; and trained (b) using a second training-data set corresponding to a second data-writing parameter configuration and corresponding ground-truth data, the machine-learning function being further trained to decode data written with the second data-writing parameter configuration and configured to output a second labelled probability array corresponding to the second training-data set, the second training-data set comprising images;

wherein the first and second training-data sets are obtained by probing the data-storage medium with a read beam and concurrently imaging the data-storage medium, and wherein the one or more logic devices are further configured to execute instructions to:

assess, based on the first and second labelled probability arrays, a reliability of decoding data written with the first data-writing parameter configuration and a reliability of decoding data written with the second data-writing parameter configuration;

select one of the first or second data-writing parameter configurations based on the reliabilities assessed of decoding data of at least the first and second training data sets; and write data to the optical data-storage medium using the selected one of the first or second data-writing parameter configurations, wherein each element of the first and second labelled probability arrays corresponds to a possible data value and represents a probability that the corresponding possible data value matches an actual data value encoded in the optical storage medium.

16. The system of claim 15 wherein the one of the first or second data-writing parameter configurations is selected further based on a metric of data-writing performance, and wherein obtaining the second training-data set comprises obtaining a training-data set with a data-writing parameter configuration adjusted so as to increase the metric of data-writing performance.

17. The system of claim 15 wherein the first and second training data sets differ with respect to the layout.

18. The system of claim 15 wherein the first and second training data sets differ with respect to one or more properties of the write-beam used to encode the data from which the respective first or second training data set was obtained.

19. The system of claim 15 wherein the first and second training data sets differ with respect to the read-beam properties, and wherein assessing the reliability comprises one or more of comparing the probability values of each element of the labeled probability array and comparing the decoded data to the corresponding ground-truth values.

* * * * *